United States Patent [19]

Wood et al.

[11] Patent Number: 4,798,629

[45] Date of Patent: Jan. 17, 1989

[54] SPIN-ON GLASS FOR USE IN SEMICONDUCTOR PROCESSING

[75] Inventors: Thomas E. Wood, Chandler; Henry G. Hughes, Scottsdale, both of Ariz.

[73] Assignee: Motorola Inc., Schaumburg, Ill.

[21] Appl. No.: 111,316

[22] Filed: Oct. 22, 1987

[51] Int. Cl.[4] ............................................... C09K 3/00
[52] U.S. Cl. .......................... 106/287.16; 106/287.13; 106/287.12
[58] Field of Search ..................... 106/287.13, 287.16, 106/287.12

[56] References Cited

U.S. PATENT DOCUMENTS

| | | | |
|---|---|---|---|
| 3,789,023 | 1/1974 | Ritchie ................................ | 252/518 |
| 3,832,202 | 8/1974 | Ritchie ................................ | 106/287.16 |
| 3,915,766 | 10/1975 | Pollack et al. ...................... | 106/287.13 |
| 4,170,690 | 10/1979 | Armbruster et al. ............... | 106/287.16 |
| 4,173,490 | 11/1979 | Rotenberg et al. ................. | 106/287.16 |
| 4,435,219 | 3/1984 | Greigger et al. .................... | 106/287.16 |
| 4,439,239 | 3/1984 | Greigger et al. .................... | 106/287.16 |
| 4,485,130 | 11/1984 | Lampin et al. ..................... | 427/387 |
| 4,518,727 | 5/1985 | Traver ................................ | 106/287.13 |
| 4,605,446 | 8/1986 | Isozaki .............................. | 106/287.16 |

OTHER PUBLICATIONS

Journal of Vacuum Science & Technology B, vol. 3, No. 5, Sep./Oct. 1985, pp. 1352–1356.

*Primary Examiner*—Paul Lieberman
*Assistant Examiner*—Helene Kirschner
*Attorney, Agent, or Firm*—Joe E. Barbee; Raymond J. Warren

[57] ABSTRACT

A spin-on glass consisting of, by volume: 1.0 parts tetraethoxysilane (TEOS, also known as tetraethylorthosilicate), methyltriethoxysilane, and dimethyldiethoxysilane in a 2/1/1 ratio; 1.1 parts ethanol (EtOH, also known as ethyl alcohol); 0.0002 parts hydrochloric acid (HCl); and 0.26 parts water ($H_2O$).

20 Claims, No Drawings

SPIN-ON GLASS FOR USE IN SEMICONDUCTOR PROCESSING

BACKGROUND OF THE INVENTION

This invention relates, in general, to spin-on glass (SOG) and, more particularly, to thick film spin-on glass used in semiconductor processing.

The use of spin-on glass is well known in the art of semiconductor processing but is limited in usable thickness. Presently, the maximum thickness utilized for spin-on glass is approximately 2000 Angstroms. Using films thicker than this cause the glass layer to become highly stressed which results in cracks developing during processing. If a thicker glass layer is desired, it would have to be put down in multiple layers separated by chemical vapor deposition (CVD) oxide. Even using multiple layers, it has been found that the maximum thickness is 4000 Angstroms, or two layers of 2000 Angstroms each separated by the CVD layer. The reason for this limitation is that the lower SOG layer cannot support more than one additional SOG layer during processing.

In addition, present experimental spin-on glasses have a shelf life of approximately one month. This makes it difficult to maintain stocks of large quantities and is greatly effected by shipping or processing delays.

Further, present attempts to make thick film spin-on glass are subject to: being detached from the substrate during normal chemical processing; or, simply falling off the substrate. These relate to adhesion and wetting problems.

Therefore, it is an object of the present invention to provide a spin-on glass that overcomes the above deficiencies.

A further object of the present invention is to provide a spin-on glass that can be utilized as a thick film in semiconductor processing.

Another object of the present invention is to provide a spin-on glass having an improved shelf life.

Still another object of the present invention is to provide a spin-on glass having improved adhesion and wetting characteristics.

Yet another object of the present invention is to provide a spin-on glass preferably having between 11.0 and 9.0 atomic weight percent carbon.

The above and other objects and advantages of the present invention are provided by the spin-on glass described herein.

SUMMARY OF THE INVENTION

A particular embodiment of the present invention consists of a spin-on glass comprising, by volume: 1.0 parts tetraethoxysilane (also known as tetraethylorthosilicate, TEOS), methyltriethoxysilane, and dimethyldiethoxysilane in a mixture which provides between 11.0 and 9.0 atomic weight percent carbon based on the hydrolyzed organo silane; 1.1 parts ethanol (EtOH, also known as ethyl alcohol); 0.0002 parts hydrochloric acid (HCl); and 0.26 parts water ($H_2O$).

DESCRIPTION

Spin-on glass films have been used for various purposes in semiconductor devices: insulation between multilayer metallizations; contouring steps in oxides or metals for improved step coverage; preventatives for auto-doping; back-filling packages; diffusion masks; and planarizing. In these applications, it is desirable for the spin-on glass to be of a thickness greater than many of the present commercially available materials can provide. The maximum thickness of the present glass is approximately 2000 Angstroms. This requires that more than one layer of glass be deposited; which, in turn, requires an intermediate layer, such as a chemical vapor deposited (CVD) oxide, be deposited.

Some recent thick film spin-on glasses have been attempted resulting in very soft glass which is inoperable in a semiconductor processing environment. These glasses have been found to have wetting problems which result in voids being left between the glass and the substrate. A further problem is in the ability to provide adhesion to the substrate. Many of the glass layers have been found to detach from the substrate during or after completion of processing. An additional problem is that the glass is unable to maintain its composition during subsequent processing. The softness of the glass leaves it subject to mechanical damage (scratches) and prone to damage from subsequent process chemicals.

One preferred embodiment of the present invention is a glass composition, comprising as the main ingredients: tetraethoxysilane (also known as tetraethylorthosilicate, TEOS)/methyltriethoxysilane/ dimethyldiethoxysilane in a 2/1/1 relationship. The compositon is then mixed with ethanol, hydrochloric acid, and water in the following parts measured by volume.

| Element | Parts |
| --- | --- |
| Tetraethoxysilane/Methyltriethoxysilane/Dimethyldiethoxysilane 2/1/1 | 1.0 |
| Ethanol | 1.1 |
| HCl | 0.0002 |
| $H_2O$ | 0.26 |

This provides a spin-on glass that is approximately 9.5 atomic weight percent of carbon. It should be noted that the above is the preferable mixture and that mixtures within the following ranges are acceptable.

| Element | Parts |
| --- | --- |
| Tetraethoxysilane/Methyltriethoxysilane/Dimethyldiethoxysilane | 1.0 |
| Ethanol | 0.7–2.7 |
| HCl | 0.0001–0.004 |
| $H_2O$ | 0.05–0.40 |

As shown in the first embodiment above, the preferred ratio of tetraethoxysilane, methyltriethoxysilane, and dimethyliethoxysilane is 2/1/1. However, the main objective is to achieve an atomic weight percent of carbon in a hydrolyzed organo silane between 25.0 and 8.0 and preferably between 11.0 and 9.0 percent. This may also be achieved through ratios of 2/2/1 and 2/1/2 as well as others.

This provides a thick film spin-on glass which provides single layer thicknesses of 10,000 Angstroms or more. In addition, the spin-on glass has been found to have a stable shelf life of more than three months. This is greatly improved over the inconsistent shelf lives of experimental thick film spin-on glasses.

Thus, it will be apparent to one skilled in the art, following a review of the above specification, that there has been provided in accordance with the invention, a spin-on glass that fully satisfies the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

I claim:

1. A spin-on glass for use in processing semiconductor devices, said spin-on glass comprising:
   a first compound of tetraethoxysilane, methyltriethoxysilane, and dimethyldiethoxysilane combined in a 2/1/1 ratio;
   ethanol;
   hydrochloric acid; and
   water.

2. The spin-on glass of claim 1 wherein said 2/1/1 compound is 1.0 parts by volume of said spin-on glass.

3. The spin-on glass of claim 1 wherein said ethanol is 1.1 parts by volume of said spin-on glass.

4. The spin-on glass of claim 1 wherein said hydrochloric acid is 0.0002 parts by volume of said spin-on glass.

5. The spin-on glass of claim 1 wherein said water is 0.26 parts by volume of said spin-on glass.

6. The spin-on glass of claim 1 wherein a mixture of tetraethoxysilane, methyltriethoxysilane, and dimethyldiethoxysilane between approximately 25.0 and 8.0 atomic weight percent carbon based on hydrolyzed organo silanes.

7. The spin-on glass of claim 1 wherein a mixture of tetraethoxysilane, methyltriethoxysilane, and dimethyldiethoxysilane having between approximately 11.0 and 9.0 atomic weight percent carbon based on hydrolyzed organo silanes.

8. The spin-on glass of claim 1 wherein a mixture of tetraethoxysilane, methyltriethoxysilane, and dimethyldiethoxysilane having approximately a 9.5 atomic weight percent carbon based on hydrolyzed organo silanes.

9. A spin-on glass for use in processing a semiconductor device, said spin-on glass comprising:
   a first compound, being 1.0 parts by volume, of tetraethoxysilane, methyltriethoxysilane, and dimethyldiethoxysilane in a 2/1/1 composition;
   ethanol being between 0.1 and 2.7 parts by volume;
   hydrochloric acid being between 0.0001 and 0.004 parts by volume; and
   water being between 0.05 and 0.40 parts by volume.

10. The spin-on glass of claim 9 wherein said ethanol is 1.1 parts of said spin-on glass.

11. The spin-on glass of claim 9 wherein said hydrochloric acid is 0.0002 parts of said spin-on glass.

12. The spin-on glass of claim 9 wherein said water is 0.26 parts of said spin-on glass.

13. The spin-on glass of claim 9 wherein a hydrolyzed solution of said first compound comprises between approximately 25.0 and 8.0 atomic weight percent of carbon.

14. The spin-on glass of claim 10 wherein a hydrolyzed solution of said first compound comprises between approximately 11.0 and 9.0 atomic weight percent of carbon.

15. The spin-on glass of claim 9 wherein a hydrolyzed solution of said first compound comprises approximately 9.5 atomic weight percent of carbon.

16. A spin-on glass for processing semiconductor devices, said spin-on glass comprising:
   a first compound being 1.0 parts by volume of said spin-on glass, said first compound comprising tetraethoxysilane, methyltriethoxysilane, and dimethyldiethoxysilane in a 2/1/1 ratio;
   ethanol being 1.1 parts by volume of said spin-on glass;
   hydrochloric acid being 0.0002 parts by volume of said spin-on glass; and
   water being 0.26 parts by volume of said spin-on glass.

17. A spin-on glass of claim 16 wherein a hydrolyzed solution of said first compound comprises between approximately 11.0 and 9.0 atomic weight precent of carbon.

18. A spin-on glass of claim 16 wherein a hydrolyzed solution of said first compound comprises approximately 9.5 atomic weight percent of carbon.

19. A spin-on glass for use in processing semiconductor devices, said spin-on glass comprising:
   a first compound of tetraethoxysilane, methyltriethoxysilane, and dimethyldiethoxysilane combined in a 2/2/1 ratio;
   ethanol;
   hydrochloric acid; and
   water.

20. A spin-on glass for use in processing semiconductor devices, said spin-on glass comprising:
   a first compound of tetraethoxysilane, methyltriethoxysilane, and dimethyldiethoxysilane combined in a 2/2/1 ratio;
   ethanol;
   hydrochloric acid; and
   water.

* * * * *

UNITED STATES PATENT AND TRADEMARK OFFICE
CERTIFICATE OF CORRECTION

PATENT NO. : 4,798,629

DATED : January 17, 1989

INVENTOR(S) : Thomas E. Wood et al.

It is certified that error appears in the above-identified patent and that said Letters Patent is hereby corrected as shown below:

Column 4, Claim 20, line 47, change "2/2/1" to -- 2/1/2 --.

Signed and Sealed this

Twenty-sixth Day of September, 1989

*Attest:*

DONALD J. QUIGG

*Attesting Officer*  *Commissioner of Patents and Trademarks*